United States Patent
Lim et al.

(10) Patent No.: US 7,825,809 B2
(45) Date of Patent: Nov. 2, 2010

(54) MARKING SYSTEM FOR A FLEX CIRCUIT OR PRINTED CABLE

(75) Inventors: Joon Hwa Lim, Singapore (SG); Manoj Kumar Dey, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 1515 days.

(21) Appl. No.: 10/753,752

(22) Filed: Jan. 7, 2004

(65) Prior Publication Data

US 2005/0156034 A1    Jul. 21, 2005

(51) Int. Cl.
    *G08B 13/14*    (2006.01)
(52) U.S. Cl. ............. 340/572.7; 340/572.8; 340/572.1; 340/539.1; 235/375; 235/385
(58) Field of Classification Search ............. 340/572.1, 340/572.3, 572.4, 572.7, 572.8, 539.1, 825.49, 340/825.69, 825.72; 235/380, 383, 385, 235/492, 375, 376; 705/22, 28; 700/213, 700/214, 109, 115; 428/209, 901; 438/14
    See application file for complete search history.

(56) References Cited

U.S. PATENT DOCUMENTS

| | | | |
|---|---|---|---|
| 4,029,006 A | 6/1977 | Mercer | 101/35 |
| 4,677,734 A | 7/1987 | Bloch et al. | 29/564.2 |
| 4,816,824 A * | 3/1989 | Katz et al. | 340/5.86 |
| 5,121,133 A | 6/1992 | Chiang | 346/1.1 |
| 5,237,917 A | 8/1993 | Traut et al. | 101/35 |
| 5,289,767 A | 3/1994 | Montalto et al. | 101/35 |
| 5,357,058 A | 10/1994 | Tanihira et al. | 174/112 |
| 5,470,644 A * | 11/1995 | Durant | 428/209 |
| 5,781,990 A | 7/1998 | Seidler et al. | 29/825 |
| 5,838,236 A * | 11/1998 | Bentley et al. | 340/572.4 |
| 6,267,296 B1 | 7/2001 | Ooshima et al. | 235/487 |
| 6,360,044 B1 | 3/2002 | Mills et al. | 385/114 |
| 6,360,948 B1 | 3/2002 | Yang et al. | 235/462.1 |
| 6,484,628 B2 | 11/2002 | Otani et al. | 101/35 |
| 6,779,726 B1 * | 8/2004 | Easton | 235/462.01 |
| 6,795,743 B1 * | 9/2004 | Bell et al. | 700/115 |
| 7,000,834 B2 * | 2/2006 | Hind et al. | 235/385 |
| 7,036,729 B2 * | 5/2006 | Chung | 235/385 |
| 2003/0063139 A1 * | 4/2003 | Hohberger et al. | |

* cited by examiner

*Primary Examiner*—Hung T. Nguyen
(74) *Attorney, Agent, or Firm*—Westman, Champlin & Kelly, P.A.

(57) ABSTRACT

A marking system or identification code for a flexible circuit or cable is disclosed. The system provides individual tracking for flexible circuits or cables assembled in data storage systems. As described, the flexible circuit or cable includes an identification code or marking on a flexible substrate for providing individual tracking for a flexible circuit or cable of a data storage device.

20 Claims, 4 Drawing Sheets

MARKING SYSTEM FOR A FLEX CIRCUIT OR PRINTED CABLE

FIELD OF THE INVENTION

The present invention relates generally to a marking system for a flexible circuit or cable, and more particularly but not by limitation to a marking system for a flex circuit or cable for a data storage device.

BACKGROUND OF THE INVENTION

Data storage devices store digitally encoded information on a disc or data storage medium. Heads read data from or write data to the disc or data storage medium. Transducer elements of the head are electrically coupled to circuitry of the data storage device for read or write operation via a printed cable or flexible circuit. The printed cable or flexible circuit are separately manufactured and assembled in the data storage device. In prior assembly operations, printed cables or flexible circuits were identified via a shipment group or lot number printed on a tray or container to provide a group tracking system. Implementation of group tracking systems may be cumbersome and costly and limit traceability of individual cables or flexible circuits assembled in data storage devices or disc drives. Embodiments of the present invention provide solutions to these and other problems, and offer other advantages over the prior art.

SUMMARY OF THE INVENTION

The present invention relates to an individual tracking system for printed flexible circuits or cables. As described, the flexible circuit or cable includes an identification code or marking on a flexible substrate for providing individual tracking for a flexible circuit or cable of a data storage device. Other features and benefits that characterize embodiments of the present invention will be apparent upon reading the following detailed description and review of the associated drawings.

DETAILED DESCRIPTION OF ILLUSTRATIVE EMBODIMENTS

Figure 1:
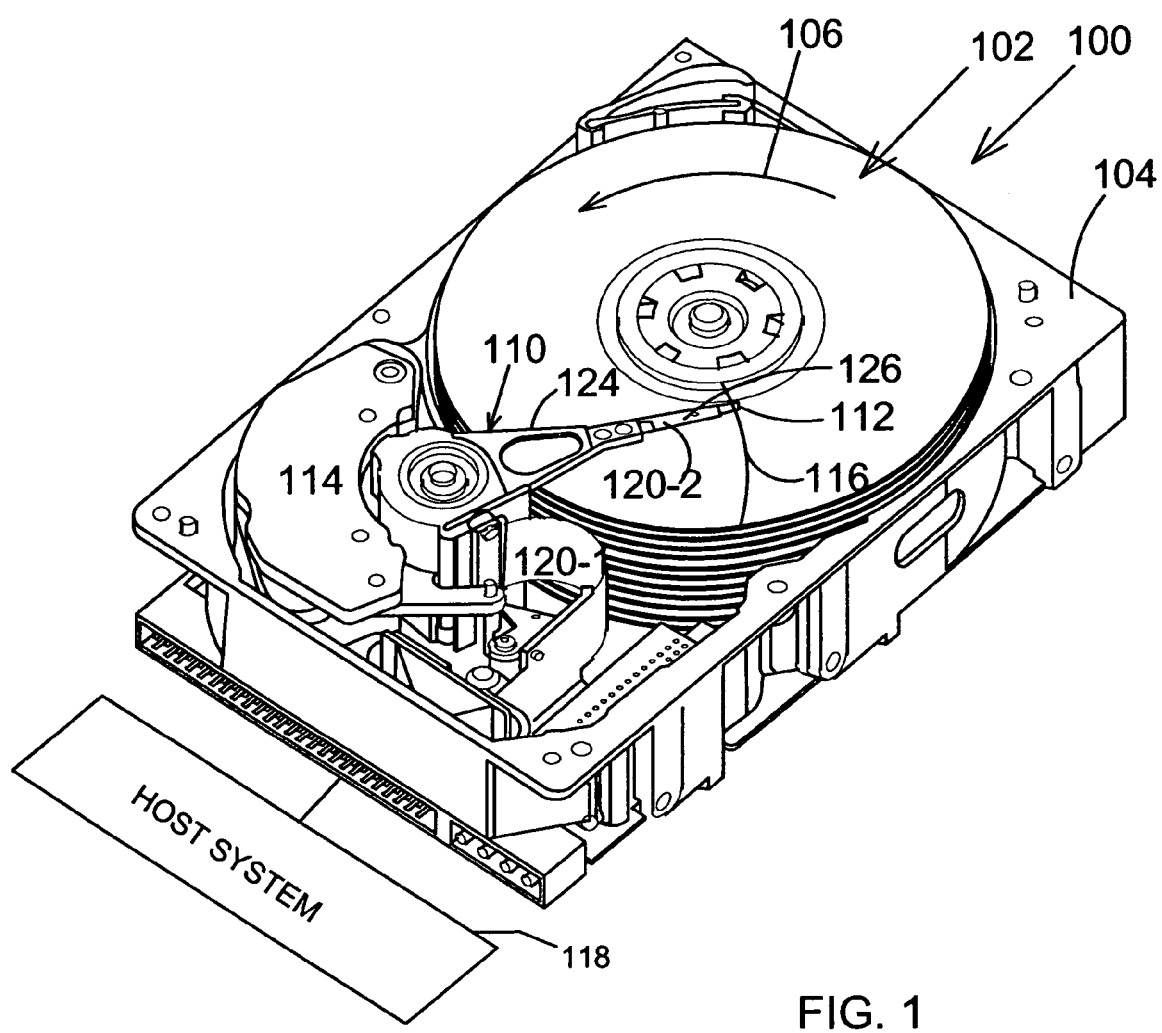
FIG. 1 is a perspective illustration of an embodiment of a data storage device.

FIG. 1 is a perspective illustration of a data storage device 100 in which embodiments of the present invention are useful. Device 100 includes a plurality of discs 102 rotationally coupled to a base chassis 104 via a spindle motor (not shown) as illustrated by arrow 106. An actuator assembly or E-block 110 supports a plurality of heads 112 (or a single head) to read data from and/or write data to the discs 102. The actuator or E-block 110 is rotated via operation of a voice coil motor (VCM) 114 to position the heads 112 as illustrated by arrow 116 relative to selected tracks on the disc 102 based upon commands or signals from a host computer or system 118 (illustrated schematically). Heads 112 include transducer elements (such as magneto-optical, magneto-resistive or inductive heads) to read data from and/or write data to the discs 102.

The head (or transducer elements) are electrically connected to drive circuitry through a printed circuit or cable assembly 120. As shown, a printed circuit or cable 120-1 is mounted to the actuator block 110 to provide an electrical interface to drive circuitry. Typically, the actuator block includes a plurality of actuator arms 124 to support a plurality of heads 112 to read data from or write data to a plurality of discs 102. In the illustrated embodiment, the device includes a head suspension assembly 126 (including heads 112) coupled to the plurality of arms 124. In the illustrated embodiment shown, a flexible circuit or cable on suspension (FOS) 120-2 provides an electrical interface to the heads (i.e. transducer elements) of the head suspension assemblies 126 from flexible circuit or cable 120-1 on the actuator block 110.

Figure 2:
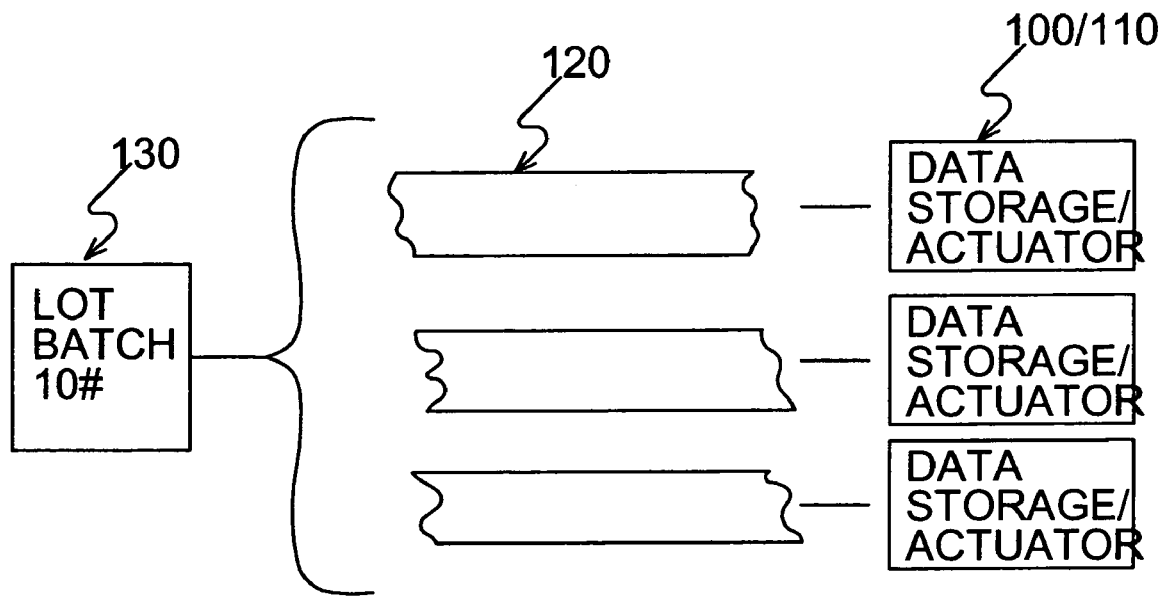
FIG. 2 is a schematic illustration of a tracking system for printed flex circuits or cables.
Figure 3:
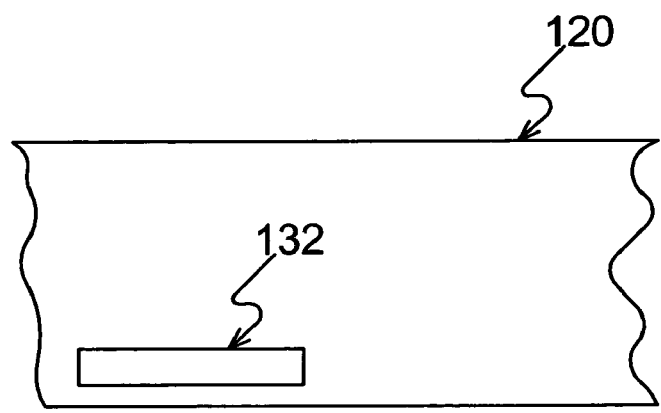
FIG. 3 is a schematic illustration of an embodiment of a flex circuit or printed cable having an identification code or marking thereon.

During manufacture a batch or lot number 130 is assigned to a lot or batch of printed flexible circuits or cables to be assembled in a data storage device 100 or relative to an actuator or E-block 110 as illustrated in the prior art embodiment of FIG. 2. Individual flexible circuits from the batch or lot of printed cables or circuits are assembled in data storage devices. To trace the origin of the flex circuits or cables assembled in data storage devices, it is necessary to record the batch or lot numbers 130 for each flexible circuit or cable assembled in order to trace the manufacture origin of each flexible circuit, which can be time consuming and costly.

The present invention provides a marking system for tracing the origin of flex circuits or cables 120. As shown, the flexible circuit or cable 120 includes a printed identification code 132 on the flex circuit or cable. The printed identification code 132 provides a unique code or serial number which corresponds to a batch or manufacture lot or manufacture information of the flex circuit or cable. The identification code 132 is printed directly on the flex circuit or cable and thus can be used to trace or identify the origin of the flexible circuit or cable 120 after assembly in a data storage device 100.

Figure 4:
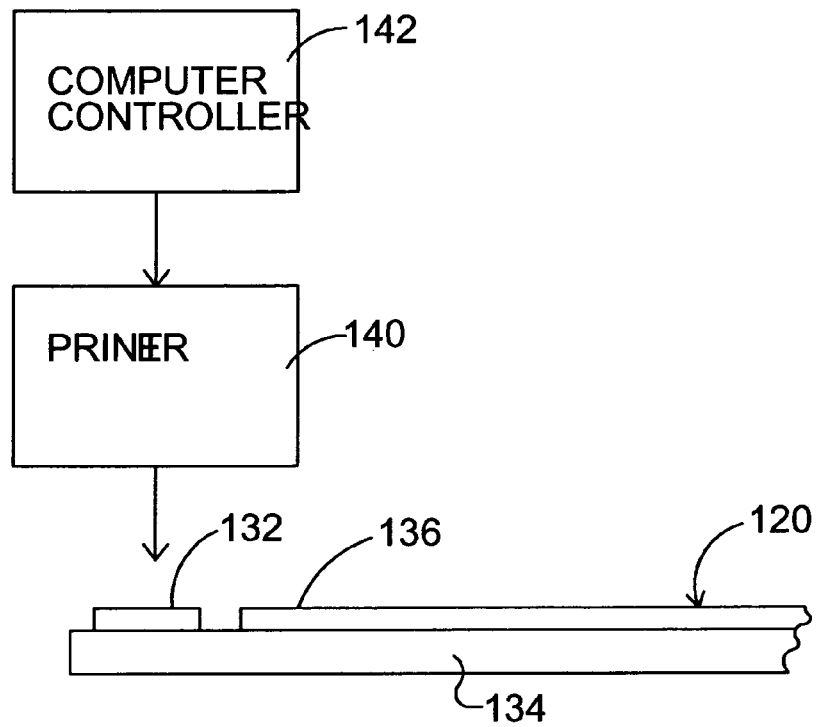
FIG. 4 is a schematic illustration of an embodiment for marking a flex circuit or cable.

As shown in FIG. 4, the flexible circuit or cable 120 includes a flexible substrate 134 having printed leads or printed circuit 136 on the flexible substrate 134. For example, the flexible substrate can be formed of a polyimide material and the flexible circuit or cable can be mounted on a rigid board (not shown) to secure the flexible circuit or cable to the actuator block 110 or the flexible circuit or cable can be used to provide an alternate circuit or connection in the data storage device. As shown, the identification code is printed on the flexible substrate 132 via a printer 140 based upon an identification code or number generated or assigned by a computer 142. In an illustrated embodiment, the identification code or number 132 is stored in a database or computer file to track the origin or manufacturing information corresponding to the identification code 132 for individual flexible circuits or cables.

Figure 5:
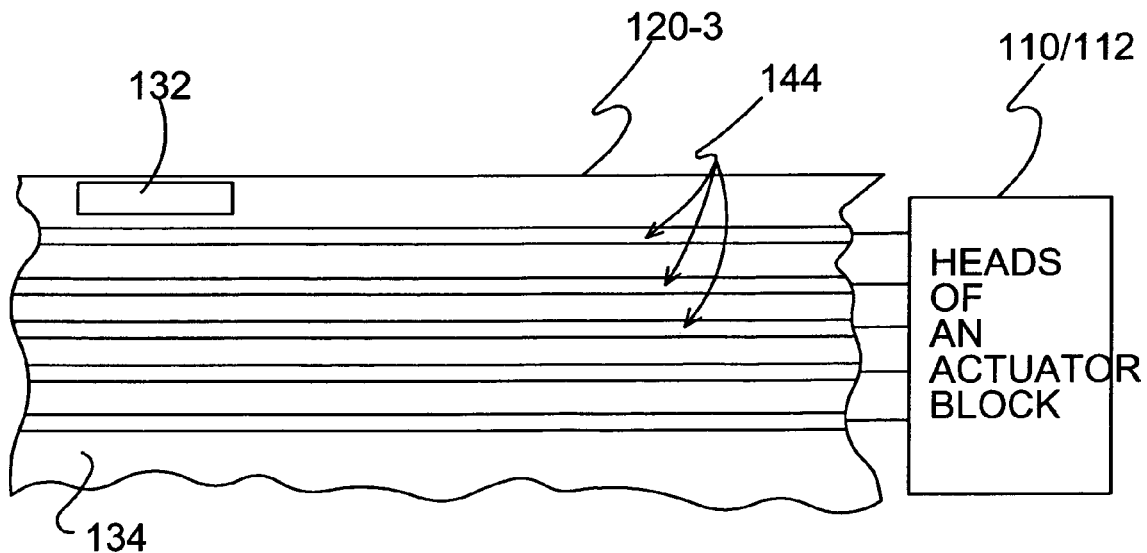
FIG. 5 is a schematic illustration of an embodiment of a flex circuit or cable having an identification code or marking and providing an electrical interface for heads of an actuator or E-block of a data storage device.

In the embodiment shown in FIG. 5, the flexible circuit or cable 120-3 includes a plurality of conductive paths or leads 144 to provide an electrical connection between drive circuitry and the heads 112 of the actuator block 110. As shown, the identification code 132 is printed on the flexible substrate 134 to provide an identification as previously described for the flexible circuit or cable 120-3. In the illustrated embodiment the identification code is printed by ink jet printing or printer to limit contact or stress to the substrate or electrostatic discharge damage to the flexible circuit or cable.

In one embodiment, a black ink-VideoJet 16-5600 and make-up fluid Video Jet 16-5605 (to remove or rework the identification code 132 as needed) of Videojet Technologies of Wood Dale, Ill. (videojet.com) are used to meet desired cleanliness and limit particulate for a data storage device. The ink or code is cured during a heat curing process at the end of the flexible circuit or cable manufacturing process and can be removed prior to curing by make-up fluids for rework. Preferably, the print gap between the print head and surface of the flex circuit ranges between 3 mm to 10 mm to provide a limited penetration depth for the substrate or the flexible circuit.

Figure 7:
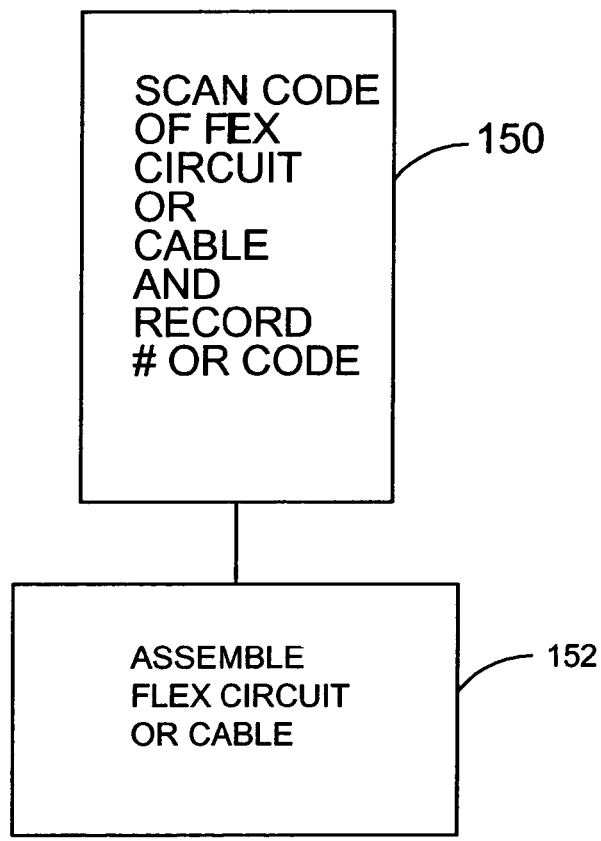
FIG. 7 illustrates an embodiment of a method for marking a flex circuit or cable for assembly in a data storage device or an actuator or E-block.
Figure 6:
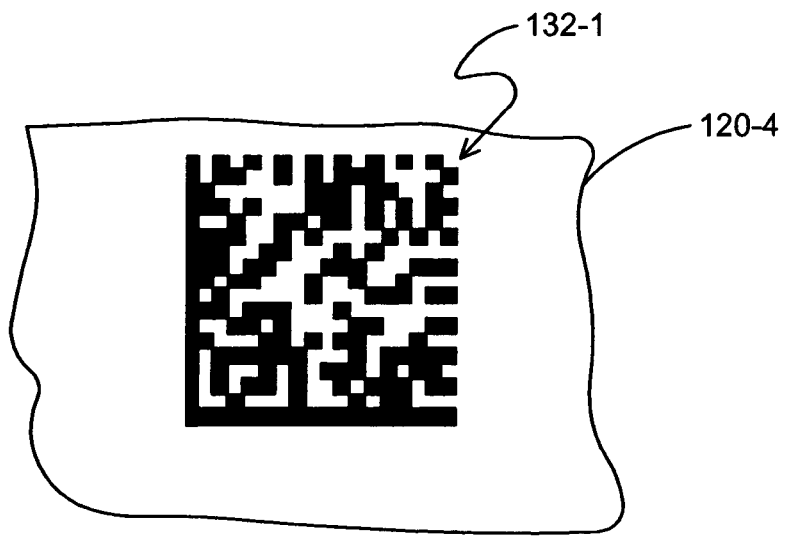
FIG. 6 is an illustration of an embodiment of a bar code marking or identification for a flex circuit or cable.

In an illustrated embodiment of FIG. 6, the identification code is a bar code 132-1 and in particular, a two dimensional data matrix bar code which provides a compact size and omni-direction reading capabilities. Preferably, the 2D data matrix bar code is a ECC level 200 to provide good error recovery with a very small footprint requirement. As previously described, during the manufacture process identification codes 132 are printed directly onto the flexible circuit or cable 120. In the embodiment, illustrated in FIG. 7, prior to assembly on a particular actuator or E-block 110 or in a data storage device 100, the flexible circuit or cable 120 is scanned to read or record the identification code 132 for the particular flexible circuit being assembled as illustrated by block 150. Thereafter, the flexible circuit or cable is assembled as illustrated by block 152. In one embodiment, the identification code 132 is correlated to the particular actuator or E-block or data storage device relative to which or in which the flexible circuit or cable is assembled or tracing the flexible circuit or cable.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application system while maintaining substantially the same functionality without departing from the scope and spirit of the present invention. In addition, although the preferred embodiment described herein is directed to a particular flexible circuit or cable for a particular data storage device, it will be appreciated by those skilled in the art that the teachings of the present invention can be applied to other flexible circuits or cables or other data storage devices without departing from the scope and spirit of the present invention.

What is claimed is:

1. A method comprising the steps of:
   printing an identification code or number on a flexible substrate of a printed flexible circuit having a plurality of leads or conductive paths;
   recording the identification code or number printed on the printed flexible circuit and source information or data associated with the printed flexible circuit in a data file or database;
   scanning the printed flexible circuit to read the identification code or number on the flexible substrate of the printed flexible circuit;
   assembling the printed flexible circuit to an assembly or sub-assembly and electrically connecting the printed flexible circuit to circuitry of the assembly or sub-assembly; and
   correlating the identification code or number of the printed flexible circuit to the assembly or sub-assembly.

2. The method of claim 1 and comprising:
   omni-directionally scanning the printed flexible circuit to read the identification code or number marked on the printed flexible circuit.

3. The method of claim 1 and comprising the step of:
   receiving a computer generated identification code or number; and
   printing the computer generated identification code or number on the flexible substrate of the printed flexible circuit.

4. The method of claim 1 wherein the step of printing comprises:
   using an ink jet printer to print the identification code or number on the flexible substrate of the printed flexible circuit.

5. The method of claim 4 and further comprising the step of:
   curing the ink of the identification code or number printed on the flexible substrate of the printed flexible circuit using the ink jet printer.

6. The method of claim 5 and comprising the step of:
   removing the identification code or number prior to curing.

7. The method of claim 1 wherein the step of assembling the printed flexible circuit to the assembly or sub-assembly comprises:
   assembling the printed flexible circuit relative to an actuator block of a data storage device and providing an electrical interface between at least one head of the data storage device and circuitry of the data storage device through the printed flexible circuit.

8. The method of claim 1 wherein printing comprises:
   printing a data matrix bar code on the flexible substrate of the printed flexible circuit.

9. The method of claim 1 wherein the source information or data includes one or more of batch, lot or manufacturing information.

10. A method comprising:
    recording batch or lot information for an assembly batch or lot of a printed flexible circuit;
    fabricating one or more leads or conductive paths on a flexible substrate to form the printed flexible circuit;
    printing an identification code or number directly on the flexible substrate of the printed flexible circuit having the one or more leads or conductive paths fabricated thereon and not on a separate label or component attached to or connected to the flexible substrate; and
    storing the identification code or number and the corresponding batch or lot information for the assembly batch or lot of the printed flexible circuit.

11. The method of claim 10 wherein the flexible substrate includes opposed surfaces and the printing comprises:
    ink jet printing the identification code or number on one of the opposed surfaces of the flexible substrate of printed flexible circuit.

12. The method of claim 11 and comprising the step of curing the ink printed on the flexible substrate following the step of ink jet printing the identification code or number on the flexible substrate.

13. The method of claim 12 wherein the step of curing comprises:
heating the ink printed on the flexible substrate of the printed flexible circuit.

14. The method of claim 10 wherein printing comprises:
printing a two-dimensional data matrix bar code on the flexible substrate of the printed flexible circuit.

15. The method of claim 10 and comprising:
electrically connecting the plurality of leads or conductive paths of the printed flexible circuit to circuitry of a data storage device.

16. The method of 10 wherein the identification code or number is printed using black ink printed directly on a polymer substrate of the printed flexible circuit.

17. A method comprising:
fabricating a plurality of conductive paths or leads on a flexible substrate to form a printed flexible circuit;
directing an ink jet stream towards a surface of the flexible substrate of the printed flexible circuit so that the ink jet stream impinges on the surface of flexible substrate;
printing an identification code or number directly on the flexible substrate of the printed flexible circuit via the ink jet stream; and
recording the identification code or number and associated manufacturing or lot information.

18. The method of claim 17 and comprising:
assembling the flexible circuit with the identification code or number printed thereon in an assembly device.

19. The method of claim 18 wherein the assembly device is a data storage device.

20. The method of claim 17 wherein the flexible substrate includes opposed surfaces including a first surface having the plurality of conductive paths or leads fabricated thereon and the ink jet stream is directed towards the first surface to print the identification code or number on the first surface of the flexible substrate having the plurality of conductive paths or leads fabricated thereon.

* * * * *